United States Patent
Li

(10) Patent No.: US 9,645,023 B2
(45) Date of Patent: May 9, 2017

(54) DISCRETE PRESSURE SENSOR WITH CANTILEVERED FORCE CENTRALIZERS

(71) Applicant: SHENZHEN NEW DEGREE TECHNOLOGY CO., LTD., Shenzhen, Guangdong (CN)

(72) Inventor: Hao Li, Guangdong (CN)

(73) Assignee: SHENZHEN NEW DEGREE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/779,820

(22) PCT Filed: Aug. 26, 2014

(86) PCT No.: PCT/CN2014/085168
§ 371 (c)(1),
(2) Date: Sep. 24, 2015

(87) PCT Pub. No.: WO2016/029354
PCT Pub. Date: Mar. 3, 2016

(65) Prior Publication Data
US 2016/0238474 A1   Aug. 18, 2016

(51) Int. Cl.
*G01L 1/26* (2006.01)
*G01L 5/00* (2006.01)
(Continued)

(52) U.S. Cl.
CPC .............. *G01L 5/00* (2013.01); *G06F 3/0414* (2013.01); *H03K 17/964* (2013.01); *H03K 17/9625* (2013.01); *G06F 2203/04102* (2013.01)

(58) Field of Classification Search
CPC .................... G01L 5/00; G06F 3/0414; G06F 2203/04102; H03K 17/9625; H03K 17/964
(Continued)

(56) References Cited

U.S. PATENT DOCUMENTS

| 4,994,781 | A * | 2/1991 | Sahagen | G01L 9/0055 338/2 |
| 5,402,666 | A * | 4/1995 | Chalpin | G01L 27/005 73/1.59 |
| 5,600,071 | A * | 2/1997 | Sooriakumar | G01L 9/0055 73/721 |
| 8,693,200 | B2 * | 4/2014 | Colgan | H01L 23/4093 361/679.52 |
| 9,222,509 | B2 * | 12/2015 | Swanson | F16C 27/02 |
| 2001/0003326 | A1 * | 6/2001 | Okada | G01L 5/165 200/516 |

(Continued)

FOREIGN PATENT DOCUMENTS

| CN | 202887103 U | 4/2013 |
| CN | 202887136 U | 4/2013 |

(Continued)

*Primary Examiner* — Max Noori
(74) *Attorney, Agent, or Firm* — Nixon & Vanderhye PC

(57) ABSTRACT

The present invention relates to the field of pressure sensor technologies, and discloses a discrete pressure sensor and an electronic device. The pressure sensor includes a pressure sensing chip and a force centralization sensing board component that is bonded onto the pressure sensing chip. The force centralization sensing board component has a hollowed area, the hollowed area has a force centralization position for centralizing force applied on the force centralization sensing board component, and the force centralization position is disposed against the pressure sensing chip. After pressure is applied in the hollowed area of the force centralization sensing board component, force is centralized to the force centralization position, conveyed to the pressure sensing chip in a centralized manner, and converted into control information to control an external electronic device through a circuit or the like of the electronic device. The discrete pressure sensor has a simple structure, and does not have a high requirement on assembly precision. In an actual application, the discrete pressure sensor is directly bonded (Continued)

onto an inner side of a front panel of the electronic device, and a user may control the electronic device through the discrete pressure sensor by touching and pressing positions in the hollowed area corresponding to the front panel. The discrete pressure sensor has a low requirement on installation, and is applicable in a wide scope.

17 Claims, 5 Drawing Sheets

(51) Int. Cl.
*G06F 3/041* (2006.01)
*H03K 17/96* (2006.01)

(58) Field of Classification Search
USPC ... 73/862.381, 862.391, 777, 781, 856, 862, 73/381
See application file for complete search history.

(56) References Cited

U.S. PATENT DOCUMENTS

| 2004/0103724 | A1* | 6/2004 | Takizawa | G01L 9/0054 73/754 |
| 2010/0270629 | A1* | 10/2010 | Tokuda | G01L 9/0042 257/415 |
| 2012/0042735 | A1* | 2/2012 | Mei | G06F 3/0338 73/862.636 |
| 2014/0022177 | A1 | 1/2014 | Shaw et al. | |

FOREIGN PATENT DOCUMENTS

| CN | 103854903 A | 6/2014 |
| CN | 203721565 U | 7/2014 |
| EP | 2 026 178 A1 | 2/2009 |

* cited by examiner

DISCRETE PRESSURE SENSOR WITH CANTILEVERED FORCE CENTRALIZERS

TECHNICAL FIELD

The present invention relates to the field of pressure sensor technologies, and in particular, to a discrete pressure sensor and an electronic device including the discrete pressure sensor.

BACKGROUND

Currently, pressure sensors are gradually applied in various fields. The pressure sensors mainly increase an amount of detected information, and provide a possibility for strength control. By means of pressure operations, switch actions, information encryption, and the like can be controlled effectively.

The pressure sensors in the prior art are generally capacitive sensors, or piezoelectric ceramic sensors, or the like. All the pressure sensors in the prior art are sensors formed by using complex circuit design and structure design. For example, a capacitive sensor needs to strictly control a distance between each capacitive point and a front panel, and obtain pressure information through a change of the distance. Therefore, a pressure sensor needs to have very high processing precision and assembly precision for implementation. A piezoelectric ceramic sensor obtains a magnitude of pressure by exerting a transient impact on a piezoelectric ceramic and obtaining a transient voltage change. In manufacturing, the piezoelectric ceramic sensor requires unified consistent piezoelectric ceramic components, and needs to be installed in a designated structure by using a special installation method. This greatly increases the use cost of pressure sensors and reduces the use scope thereof, and hinders large-scale promotion of pressure sensors, causing limitations on the use of the pressure sensors.

SUMMARY

An objective of the present invention is to provide a discrete pressure sensor to solve the problem that a pressure sensor in the prior art has a high use cost and that it is difficult to promote the use thereof because very high processing precision and assembly precision are required for implementation and a special installation method is required before the pressure sensor can be used.

The present invention is implemented as follows: A discrete pressure sensor includes a pressure sensing chip and a force centralization sensing board component that is bonded onto the pressure sensing chip, where the force centralization sensing board component has a hollowed area, the hollowed area has a force centralization position for centralizing force applied, on the force centralization sensing board component, and the force centralization position is disposed against the pressure sensing chip; the hollowed area includes the force centralization position and external vacant positions formed by external extension of the force centralization position, entities are located between adjacent external vacant positions, and a cantilever structure is formed by the entities between the adjacent external vacant positions, so that after pressure is applied in the hollowed area, the pressure is centralized to the force centralization position; and the pressure sensing chip includes a substrate and a sensing component disposed on the substrate, where the sensing component is disposed in alignment with the hollowed area.

The present invention further provides an electronic device including the foregoing discrete pressure sensor.

In comparison with the prior at in the discrete pressure sensor provided by the present invention, after pressure is applied in the hollowed area of the force centralization sensing board component, force is centralized to the force centralization position, conveyed to the pressure sensing chip in a centralized manner, and converted into control information to control the external electronic device through a circuit or the like of the electronic device. The discrete pressure sensor has a simple structure, and does not have a high requirement on assembly precision. In an actual application, the discrete pressure sensor may be directly bonded onto an inner side of a front panel of the electronic device, and a user may control the electronic device through the discrete pressure sensor by touching and pressing positions in the hollowed area corresponding to the front panel. The discrete pressure sensor has a low requirement on installation, and is applicable in a wide scope.

DESCRIPTION OF EMBODIMENTS

Figure 1:
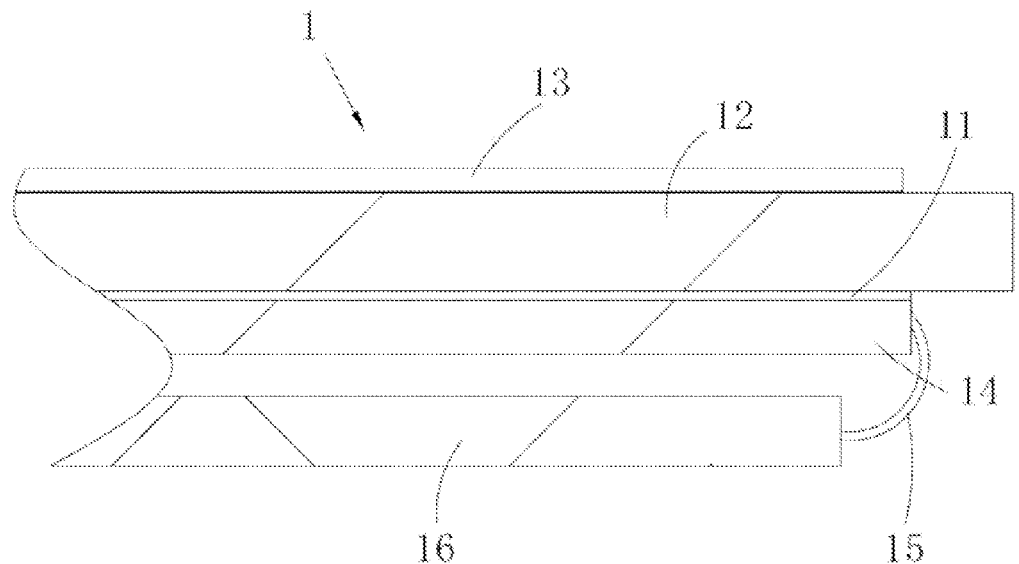
FIG. 1 is a cut-away view of a discrete pressure sensor according to an embodiment of the present invention.

To make the objective, technical solution, and advantages of the present invention more comprehensible, the following describes the present invention in detail with reference to embodiments and accompanying drawings. It should be understood that the embodiments described herein are merely specific embodiments for explaining the present invention but not intended, to limit the present invention.

The following describes the implementation of the present invention in detail with reference to specific embodiments.

FIG. 1 to FIG. 8 show exemplary embodiments provided by the present invention.

A discrete pressure sensor 1 provided by an embodiment includes a force centralization sensing board component 12 and a pressure sensing chip 14, where the force centralization sensing board component 12 is bonded onto the pressure sensing chip 14, and the two are disposed in a lamination manner. Of course, herein the force centralization sensing board component 12 may be directly bonded onto an upper surface of the pressure sensing chip 14, or the two are bonded by using an adhesive or the like, which may be determined according to an actual requirement.

The force centralization sensing board component 12 has a hollowed area 1122. The hollowed area 122 is located right above the pressure sensing chip 14. The hollowed area 122 has a force centralization position 1221. The force centralization position 1221 may centralize force applied in the corresponding hollowed area 122 on the force centralization sensing board component 12. In this manner, the force centralization sensing board component 12 is bonded onto the upper surface of the pressure sensing chip 14, and thereby the force centralized in the force centralization position 1221 may be conveyed to the pressure sensing chip 14, and the pressure sensing, chip 14 may sense the pressure applied in the corresponding hollowed area 122 and correspondingly convert the pressure into control information. Then the control information is transferred to an external control circuit or the like through a line or the like to further control corresponding operations of an electronic device or the like through the control circuit, for example, control a switch action and information encryption.

In actual use, the discrete pressure sensor 1 may be directly bonded onto an inner side of a front panel 10 of the electronic device, that is, the force centralization sensing, board component 12 is bonded onto the inner side of the front panel 10. Of course, keys or other positions for a marking pattern are disposed on the front panel 10 corresponding to the hollowed area on the force centralization sensing board component 12. In this manner, when a user needs to operate the electronic device, the user may directly press the keys and the like on the front panel 10, and further, the pressure applied on the front panel 10 is conveyed to the hollowed area 122 of the force centralization sensing board component. 12 and centralized in the force centralization position 1221 of the hollowed area 122, and by sensing the pressure in the force centralization position 1221, the pressure sensing chip 14 converts the pressure into control information and further controls the electronic, device.

The pressure sensor 1 provided above uses the force centralization sensing board component 12 and the pressure sensing chip 14 that are disposed in a lamination manner, and does not require high processing precision and assembly precision for implementing pressure sensing. Its structure is simple. When it needs to be used, it may be directly bonded onto the inner side of the front panel 10 and used without special installation. Therefore, with low use cost, it may be used in various electronic devices having a front panel 10, and widely applicable.

In addition, the force centralization sensing board component 12 and the pressure sensing chip 14 may be in a shape of a flat plate, or may be in a shape of a curved plate, or may be in other shapes of plates. The specific shape may be determined according to an actual requirement.

Specifically, the hollowed area 122 in the force centralization sensing board component. 12 includes the force centralization position 1221 and external vacant positions 1222 formed by external extension of the force centralization position 1221. In this manner, entities are located between adjacent external vacant positions 1222, the external vacant positions 1222 converge at the force centralization position 1221, and a cantilever structure is formed by the entities between the adjacent external vacant positions 1222. Therefore, after pressure is applied on the hollowed area 122 of the force centralization sensing board component 12, the pressure is centralized to the force centralization position 1221 of the hollowed area 122.

Figure 5:
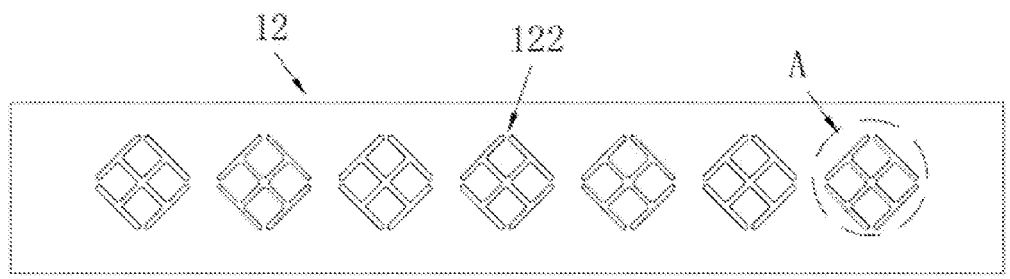
FIG. 5 is a main schematic view of a force centralization sensing board component according to an embodiment of the present invention.
Figure 6:
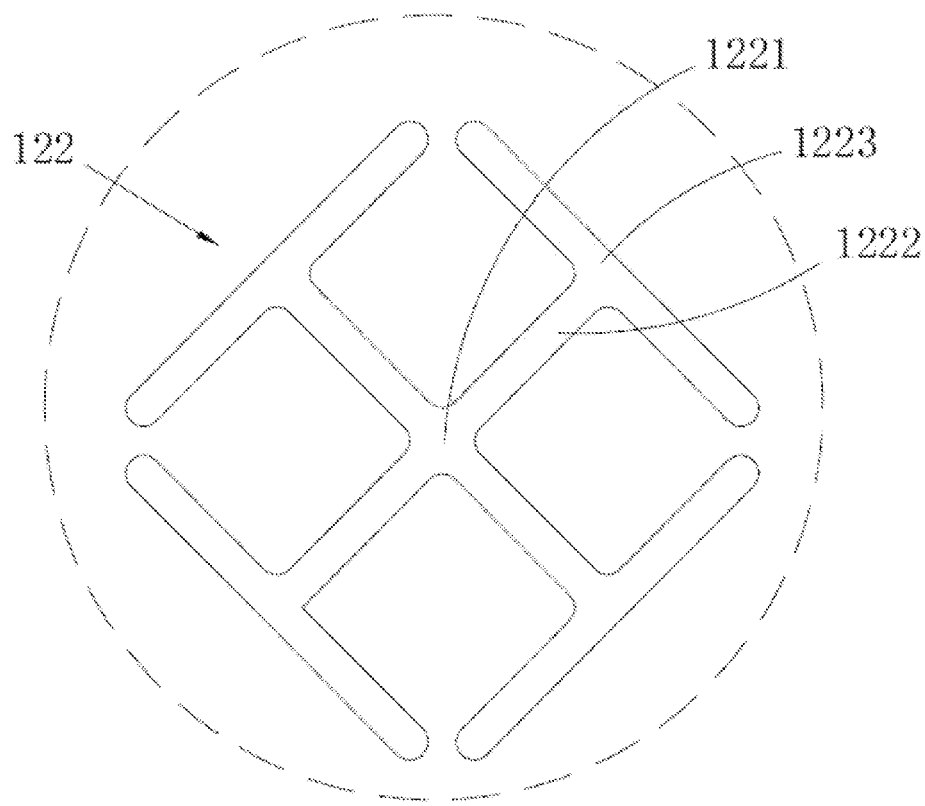
FIG. 6 is a schematic view of magnified position A in FIG. 5.

As shown in FIG. 5 and FIG. 6, the force centralization position 1221 of the force centralization sensing board component 12 provided by this embodiment extends externally to form four external vacant positions 1222, and the end of each external vacant position 1222 extends towards two sides to form bar-shaped vacant positions 1223, and the bar-shaped vacant positions 1223 formed by the ends of the external vacant positions 1222 are closed to take on a shape of a broken square. Of course, in this embodiment, there may be a plurality of external vacant positions 1222, that is, two or more than two, and the shape of the enclosure formed by the external vacant positions varies according the quantity of the external vacant positions 1222.

Figure 7:
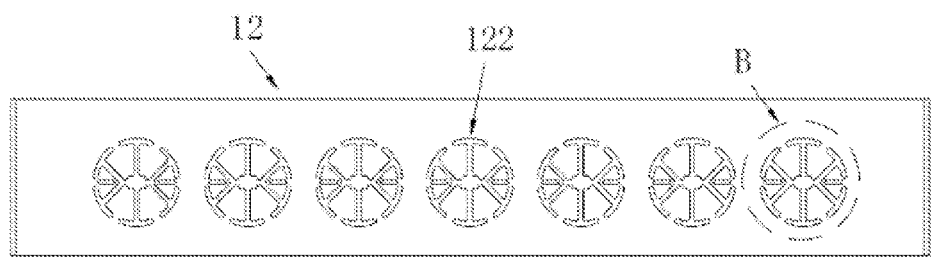
FIG. 7 is a main schematic view of another force centralization sensing board component according to an embodiment of the present invention and FIG. 8 is a schematic view of magnified position B in FIG. 7.
Figure 8:
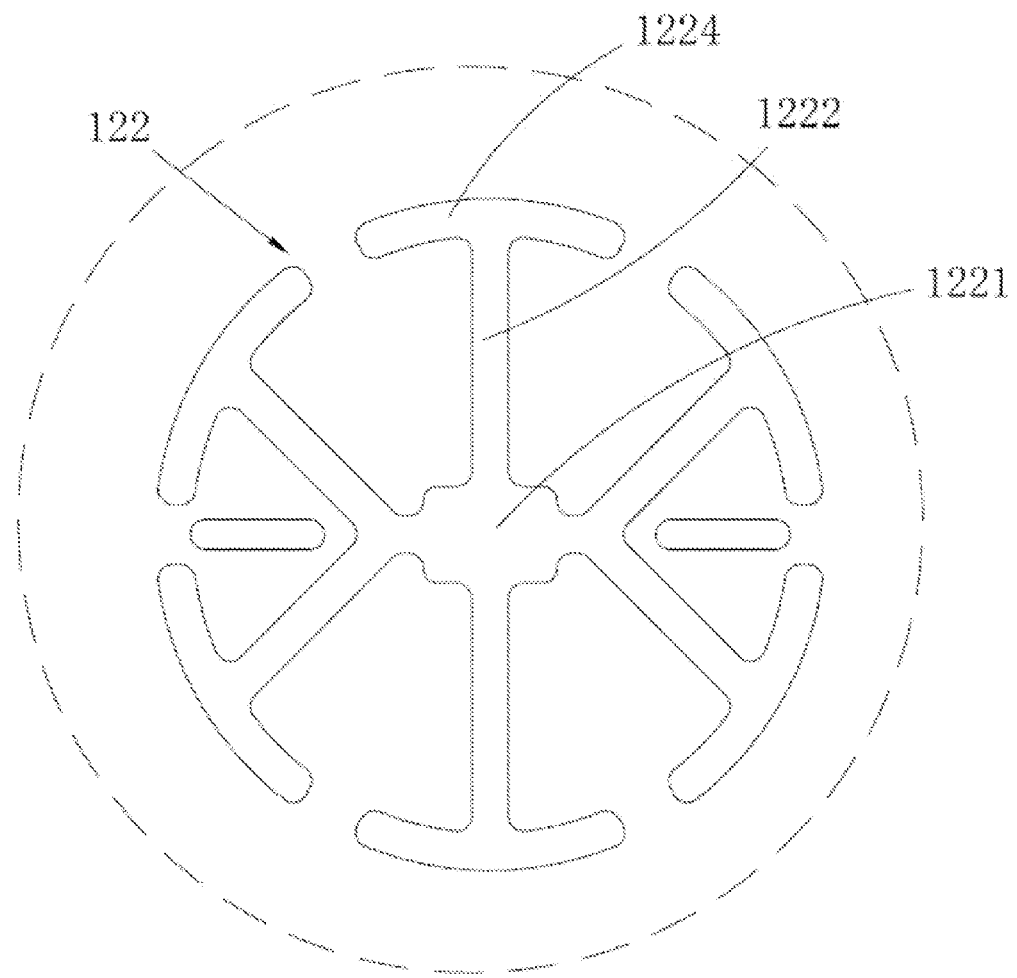

As shown in FIG. 7 and FIG. 8, an embodiment provides another force centralization sensing board, component 12. A force centralization position in the force centralization sensing board component 12 extends externally to form six external vacant positions 1222, ends of the six external vacant positions 1222 form arc-shaped vacant positions 1224, and the six arc-shaped vacant positions 1224 are closed to take on a shape of a broken circle. Of course, in this embodiment, there may be a plurality of external vacant positions 1222, that is, two or more than two, and the shape of the enclosure formed by the external vacant positions varies according the quantity of the external vacant positions 1222.

Of course, in other embodiments, a hollowed, area 122 may also be in other shapes, so long as external vacant positions 1222 are formed by external extension of a force centralization position 1221. The shapes and paths of external extension of the external vacant positions 1222 may be diversified, and are not limited to the shapes in this embodiment.

In the hollowed area 122 in the force centralization sensing board component 12, positions corresponding to the keys of the front panel 10 in the force centralization sensing board component 12 are divided into several portions, and in each portion, a short entity is reserved and connected to the force centralization sensing, board component 12.

Figure 4:
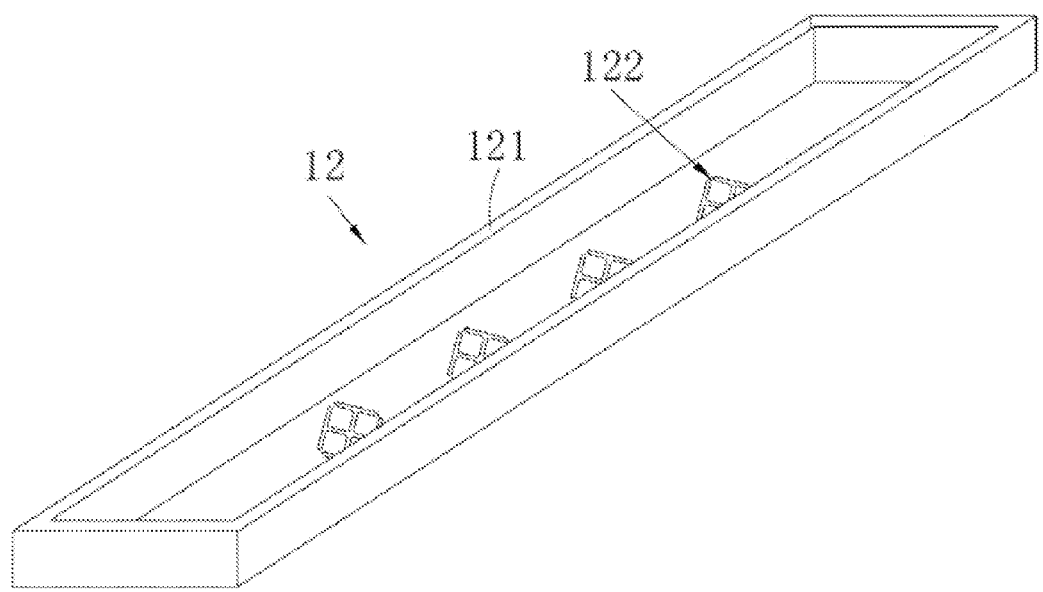
FIG. 4 is a reverse three-dimensional schematic view of a force centralization sensing board component according to an embodiment of the present invention.

In this embodiment, as shown in FIG. 4, to enhance strength of the force centralization sensing board component 12 and fix the force centralization sensing board component 12, a fixing structure is disposed at edges of the force centralization sensing board component 12, so that after the force centralization sensing, board component 12 is disposed on the pressure sensing chip 14, its position may be fixed.

Specifically, the fixing structure includes fixing edge strips 121. The fixing edge strips 121 are disposed at the edges of the force centralization sensing board component 12, and bend downward, and take on a bending shape with the force centralization sensing board component 12. Therefore, the entire force centralization sensing board component 12 takes on a shape of a reversely worn cap.

Alternatively, in other embodiments, the fixing structure on the force centralization sensing hoard component 12 may be a plurality of other structures, for example, supporting ribs disposed at the edges of the force centralization sensing board component 12. The force centralization sensing board component 12 can also be substantially a planar board, that is, there is no protruding structure disposed at a periphery of the force centralization sensing board component 12, and a thickness of the whole force centralization sensing hoard component 12 is substantially uniform.

The pressure sensing chip includes a substrate and a sensing component disposed on the substrate. In this embodiment, a pressure sensing chip 14 is configured to implement a pressure sensing function. The pressure sensing chip 14 specifically includes a film substrate and a sensing component disposed on the film substrate. The film substrate may be made up of materials of PET, PC, PI, and the like.

After the force centralization sensing board component 12 is disposed on the pressure sensing chip 14, the sensing component on the substrate is disposed in alignment with the hollowed area 122 in the force centralization sensing board component 12.

Specifically, the sensing component is a coating or a line printed on a pressure sensing layer and capable of sensing pressure.

In an actual application, the pressure sensing chip 14 may be a printed polymer coating that has pressure sensing performance, or may be a sintered piezoelectric ceramic coating, or the like, but is not limited thereto. The pressure sensing chip 14 may be a single independent pressure sensor, or may be any measurement apparatus capable of sensing pressure.

Alternatively, in other embodiments, the pressure sensing chip 14 may employ other technologies, for example, quantum tunneling composite, capacitive sensor, or other pressure sensing resistor technologies.

Figure 2:
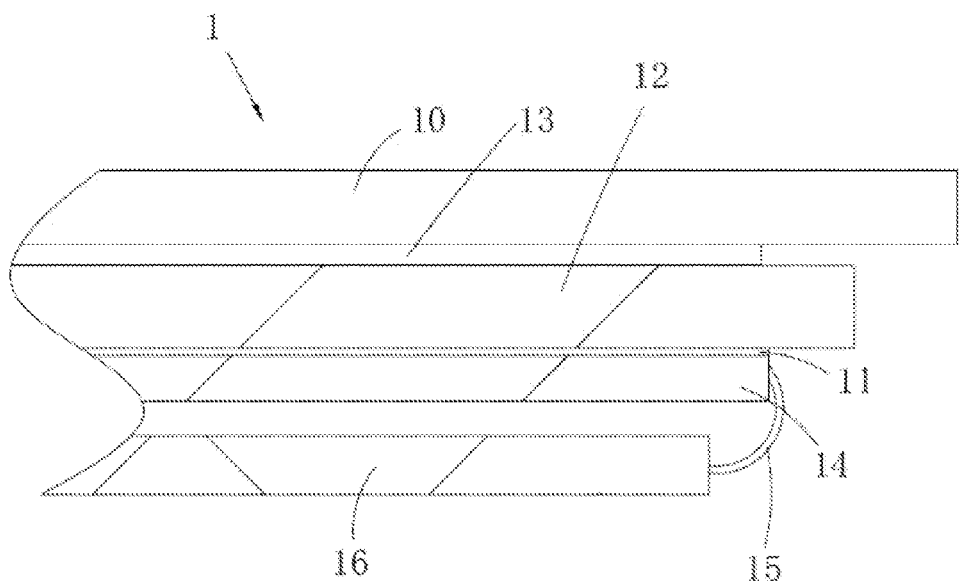
FIG. 2 is a cut-away view of a discrete pressure sensor having a front panel according to an embodiment of the present invention.
Figure 3:
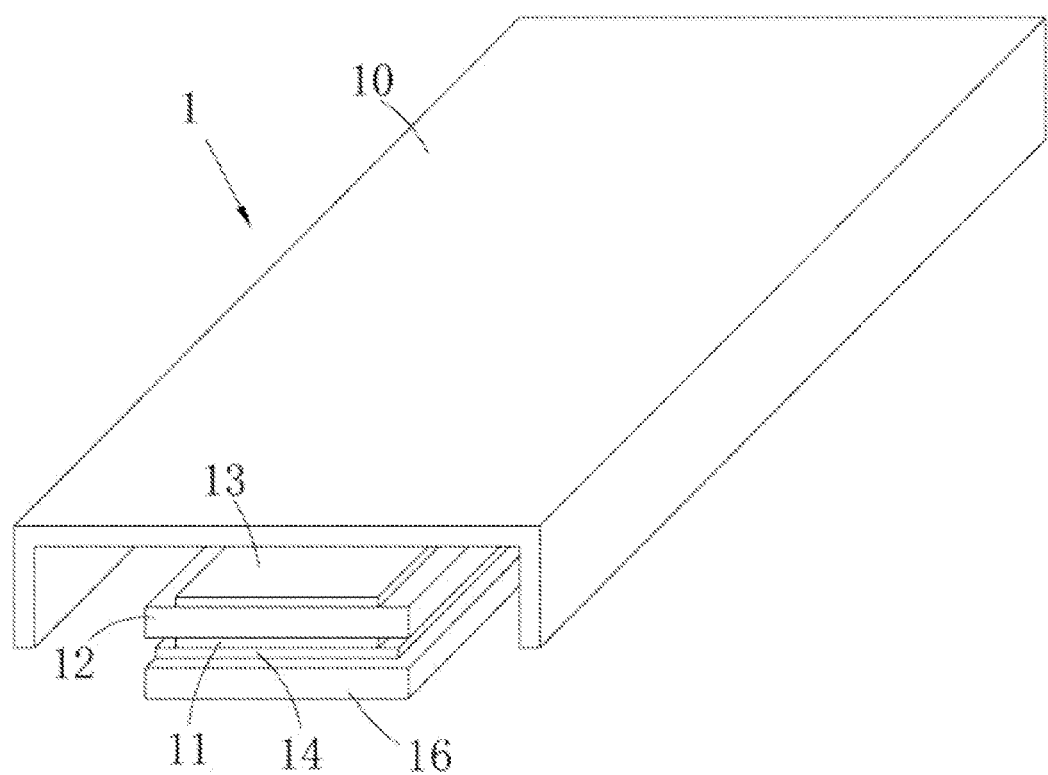
FIG. 3 is a three-dimensional schematic view of a discrete pressure sensor according, to art embodiment of the present invention.

In this embodiment, referring to FIG. 1 to FIG. 3, the discrete pressure sensor 1 further includes a detection circuit 16. The pressure sensing chip 14 is connected to the detection circuit 16 by using a connecting line 15. The connecting line 15 is connected to the detection circuit 16. Of course, the connecting line 15 is merely used to describe a manner of connection between the pressure sensing chip 14 and the detection circuit 16, and in other embodiments, the pressure sensing chip 14 may also be electrically connected to the detection circuit 16 directly or indirectly in other manners.

The detection circuit 16 may act as a control center. The detection circuit 16 receives control information transferred from the pressure sensing chip 14, and further controls the electronic device or the like. The detection circuit 16 is generally described as a combination of hardware and software having a plurality of processing methods. The hardware and software are configured to feed back the control information input by the pressure sensing chip 14, or communicate with a system associated with a customer, and execute additional related tasks or functions.

In this embodiment, the detection circuit 16 may be implemented as a general processor, a content addressable memory, a digital signal processor, a digital-to-analog conversion switch, a programmable logic device, a discrete hardware assembly, or other combinations. In addition, algorithm and software information related to a pressure touch screen or a pressure sensing system is embedded in the detection circuit 16.

The hardware and software in the detection circuit 16 are configured to execute a plurality of functions, technologies, feedback, and processing tasks associated with the system of the customer.

In this embodiment, the force centralization sensing board component 12 and the pressure sensing chip 14 are directly bonded by using a first adhesive 11. Of course, the first adhesive 11 may be a double-sided adhesive, a VHB acrylic foam adhesive, an epoxy glue, a polyurethane adhesive, a silica gel, or other similar objects. The selection and thickness of these adhesive materials are decided according to materials of the force centralization sensing board component 12 and the pressure sensing chip 14.

In addition, for ease of use in this embodiment, the pressure sensor 1 may be directly bonded onto the inner side of the front panel 10 of the electronic device, and a second adhesive 13 is disposed on the upper surface of the force centralization sensing board component 12. Of course, the second adhesive 13 may also be a double-sided adhesive, a VHB acrylic foam adhesive, an epoxy glue, a polyurethane adhesive, a silica gel, or other similar objects. In this manner, the user may directly bond the pressure sensor 1 onto the inner side of the front panel 10 of the electronic device by using the second adhesive 13 on the force centralization sensing board component 12.

In this embodiment, the discrete pressure sensor 1 further includes the front panel 10. The front panel 10 is bonded onto the upper surface of the force centralization sensing board component 12. The front panel 10 is a board component that has performance of flexibility and deformability. It is available for user operations, and maintains structural rigidity for the user. That the front panel 10 has performance of flexibility and deformability means that the front panel 10 is flexible and deformable, and capable of recovering to an original status, which includes maintaining electronic and structural functions of the front panel. For example, the front panel 10 may be bent and deformed along a central axis; or the front panel 10 may be collapsed and formed along one point; or the front panel 10 has enough flexibility and deformability to adapt to the lower-layer force centralization sensing board component 12 and pressure sensing chip 14, that is, the front panel 10, the force centralization sensing board component 12, and the pressure sensing chip 14 are deformed synchronously, and a phenomenon of misalignment will not occur.

The front panel 10 can maintain its rigid structure, because the front panel 10 itself will not be deformed and collapsed without external force.

Specifically, the front panel 10 may be made up of stainless steel, metal, glass, or plastic of a certain thickness; or the front panel 10 may be made up of a transparent material, and the thickness of the material is sufficient for maintaining flatness of the front panel 10. In a word, the front panel 10 may be made up of any material, so long as it has enough rigidity and has flexibility and deformability and can recover to the original status.

In addition, a marking pattern is disposed on the outer surface of the front panel 10, and thereby, after the force centralization sensing board component 12 is bonded onto the front panel, the hollowed area 122 on the force centralization sensing board component 12 may be aligned with the marking pattern to identify preset press positions.

An embodiment of the present invention further provides an electronic device, where the electronic device includes the discrete pressure sensor 1 provided above. The discrete pressure sensor 1 is bonded onto an inner side of a front panel of the electronic device, and thereby by means of touching and pressing, a marking pattern such as keys on the surface of the front panel, pressure may be centralized by the force centralization sensing board component 12 and conveyed to a pressure sensing chip 14, and thereby the pressure is converted into control information to further control operations of the electronic device.

The discrete pressure sensor 1 may be directly bonded onto the inner side of the front panel. It does not have a high requirement on installation precision. With a simple structure, the discrete pressure sensor 1 has advantages of low cost, ease of installation, and wide applicability.

Only exemplary embodiments of the present invention are described above. However, the present invention is not limited thereto. All modifications, equivalent replacements, and improvements made without departing from the spirit and principle of the present invention shall fall within the protection scope of the present invention.

What is claimed is:

1. A discrete pressure sensor, comprising:
   a pressure sensing chip, and
   a force centralization sensing board component that is bonded onto the pressure sensing chip, the force centralization sensing board component comprising a sheet having a cutout pattern defining at least first and second cantilevered structures arranged in a symmetrical configuration, the first cantilevered structure having a first attaching portion and a first distal portion, the second cantilevered structure having a second attaching portion and a second distal portion, the first and second cantilevered structures directing force applied on the force centralization sensing board component toward the pressure sensing chip at a force centralization position defined between the first distal portion of the first cantilevered structure and the second distal portion of the second cantilevered structure.

2. The discrete pressure sensor according to claim 1, wherein the cutout pattern includes a plurality of vacant areas, at least some of the vacant areas being bar-shaped.

3. The discrete pressure sensor according to claim 1, wherein the cutout pattern includes a plurality of vacant areas, at least some of the vacant areas being arc-shaped.

4. The discrete pressure sensor according to claim 1, wherein the force centralization sensing board component includes one or more edges extending from the sheet toward a side of the force centralization sensing board component.

5. The discrete pressure sensor according to claim 1, wherein the force centralization sensing board component and the pressure sensing chip are bonded with a first adhesive.

6. The discrete pressure sensor according to claim 1, wherein the discrete pressure sensor further comprises a detection circuit electrically connected to the pressure sensing chip.

7. The discrete pressure sensor according to claim 1, wherein the discrete pressure sensor further comprises a front panel, wherein the front panel is bonded to the force centralization sensing board component.

8. The discrete pressure sensor according to claim 7, wherein the force centralization sensing board component and the front panel are bonded with a second adhesive.

9. The discrete pressure sensor according to claim 7, wherein the front panel is deformable.

10. The discrete pressure sensor according to claim 7, wherein a marking pattern is disposed on the front panel at a location aligned with the cutout pattern in the force centralization sensing board.

11. The discrete pressure sensor according to claim 1, wherein the pressure sensing chip comprises a substrate and a sensing component disposed on the substrate, the sensing component being disposed at a location in alignment with the cutout pattern.

12. The discrete pressure sensor according to claim 1, wherein the force centralization sensing board component comprises a substantially planar board having no protruding structure disposed at periphery thereof, and substantially uniform thickness.

13. An electronic device, comprising the discrete pressure sensor according to claim 1, the discrete pressure sensor being connected to control at least one circuit.

14. The electronic device according to claim 13, wherein the discrete pressure sensor is directly bonded onto an inner side of the front panel, the front panel being bonded to an upper surface of the force centralization sensing board component.

15. The electronic device according to claim 13, wherein the front panel and the force centralization sensing board component deform together.

16. A control panel comprising:
   a panel having markings thereon;
   a pressure sensor, and
   a force centralizer sheet having a cutout pattern defining plural symmetrically-arranged deformable cantilevered structures each having an attaching portion and a distal portion, the force centralizer sheet being bonded between the pressure sensor and the panel so the plural cantilevered structures are disposed in registry with the markings and the pressure sensor is disposed at a force centralization position defined between the distal portions of the plural cantilevered structures, the plural cantilevered structures deforming in response to deformation of the panel to centralize force toward the pressure sensor.

17. The control panel of claim 16, wherein the panel includes an unperforated steel planar portion having first and second sides, the markings being disposed on the first side of the steel planar portion, the force centralizer sheet being bonded to the second side of the steel planar portion.

* * * * *